(12) United States Patent
Huang et al.

(10) Patent No.: US 9,385,010 B2
(45) Date of Patent: Jul. 5, 2016

(54) MULTIPLE SWIVEL ARM DESIGN IN HYBRID BONDER

(71) Applicant: Taiwan Semiconductor Manufacturing Company, Ltd., Hsin-Chu (TW)

(72) Inventors: Xin-Hua Huang, Xihu Township (TW); Ping-Yin Liu, Yonghe (TW); Lan-Lin Chao, Sindian (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/278,742

(22) Filed: May 15, 2014

(65) Prior Publication Data

US 2015/0332939 A1 Nov. 19, 2015

(51) Int. Cl.
*H01L 21/67* (2006.01)
*H01L 21/02* (2006.01)

(52) U.S. Cl.
CPC ...... *H01L 21/67051* (2013.01); *H01L 21/0206* (2013.01); *H01L 21/0234* (2013.01); *H01L 21/02041* (2013.01); *H01L 21/02052* (2013.01); *H01L 21/02057* (2013.01); *H01L 21/02334* (2013.01); *H01L 21/02343* (2013.01); *H01L 21/6708* (2013.01); *H01L 21/6715* (2013.01)

(58) Field of Classification Search
CPC ............. H01L 21/67051; H01L 21/6708; H01L 21/6715; H01L 21/02334; H01L 21/0234; H01L 21/02343; H01L 21/02041; H01L 21/0206; H01L 21/02057; H01L 21/02052
See application file for complete search history.

(56) References Cited

U.S. PATENT DOCUMENTS

| | | | |
|---|---|---|---|
| 7,153,364 B1* | 12/2006 | Rangarajan | B05B 15/02 118/323 |
| 2002/0006876 A1* | 1/2002 | Hongo | B24B 37/345 156/345.12 |
| 2013/0078381 A1* | 3/2013 | Miyagi | H01L 21/67051 427/345 |
| 2014/0238443 A1* | 8/2014 | Lee | H01L 21/02052 134/21 |

\* cited by examiner

*Primary Examiner* — Phat X Cao
(74) *Attorney, Agent, or Firm* — Slater Matsil, LLP (57) ABSTRACT

An apparatus for cleaning a wafer includes a wafer station configured to hold the wafer, and a first and a second dispensing system. The first dispensing system includes a first swivel arm, and a first nozzle on the first swivel arm, wherein the first swivel arm is configured to move the first nozzle over and aside of the wafer. The first dispensing system includes first storage tank connected to the first nozzle, with the first nozzle configured to dispense a solution in the first storage tank. The second dispensing system includes a second swivel arm, and a second nozzle on the second swivel arm, wherein the second swivel arm is configured to move the second nozzle over and aside of the wafer. The second dispensing system includes a second storage tank connected to the second nozzle, with the second nozzle configured to dispense a solution in the second storage tank.

20 Claims, 9 Drawing Sheets

MULTIPLE SWIVEL ARM DESIGN IN HYBRID BONDER

BACKGROUND

In wafer-to-wafer bonding technology, various methods have been developed to bond two package components (such as wafers) together. The available bonding methods include fusion bonding, eutectic bonding, direct metal bonding, hybrid bonding, and the like. In fusion bonding, an oxide surface of a wafer is bonded to an oxide surface or a silicon surface of another wafer. In eutectic bonding, two eutectic materials are placed together, and a high pressure and a high temperature are applied. The eutectic materials are hence melted. When the melted eutectic materials solidify, the wafers bond together. In direct metal-to-metal bonding, two metal pads are pressed against each other at an elevated temperature, and the inter-diffusion of the metal pads causes the bonding of the metal pads. In hybrid bonding, the metal pads of two wafers are bonded to each other through direct metal-to-metal bonding, and an oxide surface of one of the two wafers is bonded to an oxide surface or a silicon surface of the other wafer.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A cleaning module design and the method of cleaning using the cleaning module are provided in accordance with various exemplary embodiments. The intermediate stages of performing the cleaning are illustrated. The variations of the embodiments are discussed. Throughout the various views and illustrative embodiments, like reference numbers are used to designate like elements.

Figure 1:
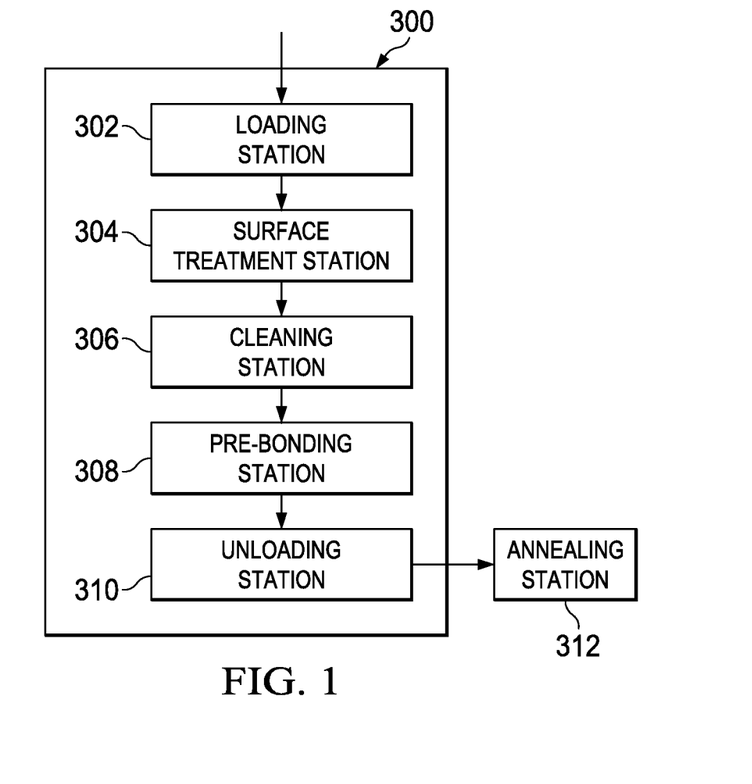
FIG. 1 schematically illustrates a process flow and a hybrid bonding system in accordance with some embodiments.

FIG. 1 schematically illustrates a process flow and a hybrid bonding system (bonder) 300 for performing the process flow. Hybrid bonding system 300 is used to bond two package components through hybrid bonding. The process flow in accordance with the embodiments is briefly described below, and the details of the process flow and the hybrid bonding system 300 are discussed, referencing the process steps shown in FIGS. 2 through 10.

Referring to FIG. 1, the package components that are to be bonded (for example, package components 100 and 200 in FIGS. 2 and 3, respectively) are loaded into hybrid bonding system 300 through loading station 302. Hybrid bonding system 300 may be located in a controlled environment filled with, for example, clean air or nitrogen. Alternatively, hybrid bonding system 300 is located in open air. Next, a surface treatment/activation is performed on the surfaces of the package components, wherein the surface treatment is performed in surface treatment station 304. In the surface treatment, the exposed surfaces of the dielectric materials in the package components are activated. A cleaning step is then performed on the package components to remove metal oxides, chemicals, particles, and other undesirable substances from the surfaces of the package components. Cleaning station 306 is configured to perform the cleaning step in accordance with some embodiments.

A pre-bonding is then performed to bond the package components together. The pre-bonding is performed in pre-bonding station 308. After the pre-bonding, the package components are bonded to each other. The bonded package components may then be unloaded from hybrid bonding system 300 through unloading station 310 and transferred into annealing station 312. The bonding strength is then enhanced through a thermal annealing, which is held in thermal annealing station 312.

Figure 2:
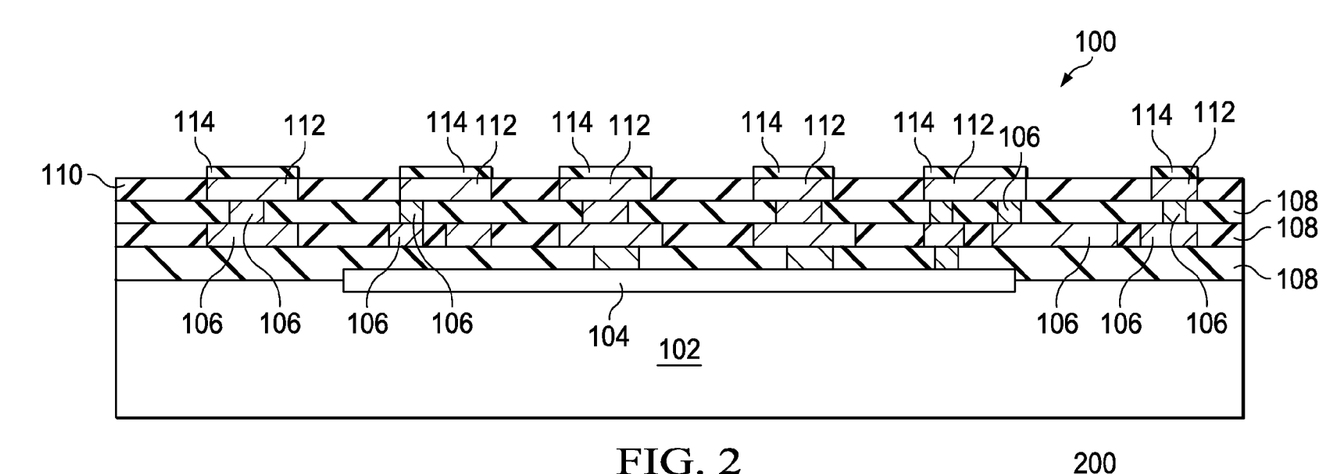
FIGS. 2 through 5 illustrate the cross-sectional views of intermediate stages in the hybrid bonding of two wafers in accordance with some embodiments.

A detailed hybrid bonding process is discussed herein, referencing FIGS. 2 through 11. Referring to FIG. 2, package component 100 is illustrated. Package component 100 may comprise a device wafer, a package substrate strip, an interposer wafer, or the like. In the embodiments in which package component 100 comprises a device wafer, package component 100 may include semiconductor substrate 102, which may be, for example, a silicon substrate, although other semiconductor substrates are also usable. Active devices 104 may be formed on a surface of substrate 102, and may include, for example, transistors. Metal lines and vias 106 are formed in dielectric layers 108, which may be low-k dielectric layers in some embodiments. The low-k dielectric layers 108 may have dielectric constants (k values) lower than, for example, about 3.5, lower than about 3.0, or lower than about 2.5. Dielectric layers 108 may also comprise non-low-k dielectric materials with dielectric constants (k values) greater than 3.9. Metal lines and vias 106 may comprise copper, aluminum, nickel, tungsten, or alloys thereof. Metal lines and vias 106 interconnect active devices 104, and may connect active devices 104 to the overlying metal pads 112.

In alternative embodiments, package component 100 is an interposer wafer, which is free from active devices therein. Package component 100 may or may not include passive devices (not shown) such as resistors, capacitors, inductors, transformers, and the like in accordance with some embodiments.

In yet alternative embodiments, package component 100 is a package substrate strip. In some embodiments, package component 100 includes laminate package substrates, wherein conductive traces 106 (which are schematically illustrated) are embedded in laminate dielectric layers 108. In alternative embodiments, package components 100 are build-up package substrates, which comprise cores (not shown) and conductive traces (represented by 106) built on the opposite sides of the cores.

In each of the embodiments wherein package component 100 is a device wafer, an interposer wafer, a package substrate strip, or the like. Surface dielectric layer 110 is formed at the surface of package component 100. In some embodiments, surface dielectric layer 110 is a silicon containing a dielectric layer, which may comprise silicon oxide, SiON, SiN, or the like. Metal pads 112 are formed in surface dielectric layer 110 and may be electrically coupled to active devices 104 through metal lines and vias 106. Metal pads 112 may also be formed from copper, aluminum, nickel, tungsten, or alloys thereof. The top surface of surface dielectric layer 110 and the top surfaces of metal pads 112 are substantially level with each other. FIG. 2 also illustrates metal oxides regions 114 formed on the surfaces of metal pads 112. Metal oxide regions 114 may be the native oxide regions that are formed due to the exposure of metal pads 112 to open air.

In the embodiments wherein package component 100 is a device wafer, surface dielectric layer 110 and metal pads 112, which are used for the subsequent bonding, may be on the front side (the side with active devices 104) or the back side of substrate 102, although FIG. 2 illustrates that surface dielectric layer 110 and metal pads 112 are on the front side of substrate 102.

Figure 3:
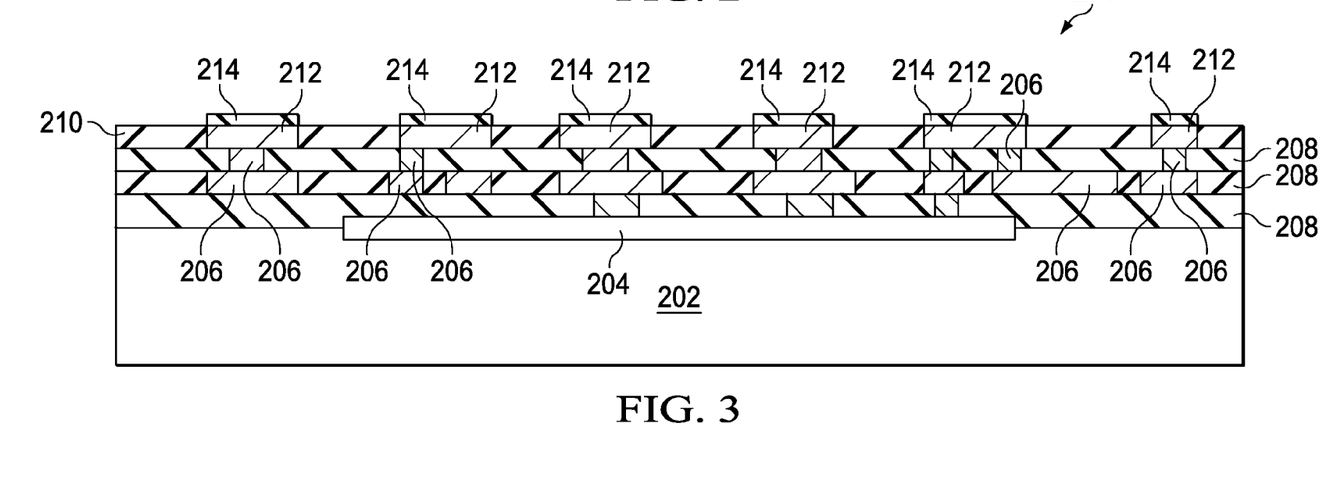

FIG. 3 illustrates package component 200, which is to be bonded to package component 100. Package component 200 may also be selected from a device wafer, an interposer wafer, a package substrate, and the like. In the illustrated FIG. 3, package component 200 includes substrate 202, active devices 204, dielectric layers 208, metal lines and vias 206 in dielectric layers 208, surface dielectric layer 210, and metal pads 212. Package component 200 may have a structure similar to what is described for package component 100, and the details are not repeated herein. The materials of the features in package component 200 may be found by referring to the like features in package component 100, with the like features in package component 100 starting with number "1," which features correspond to the features in package component 200 and having reference numerals starting with number "2."

Next, package component 100 is loaded into surface treatment station 304, which is a part of hybrid bonding system 300 in FIG. 1. A surface treatment is performed on the surface of package component 100. In some embodiments, the surface treatment includes a plasma treatment.

The plasma treatment may be performed in a vacuum environment (a vacuum chamber, not shown), for example, which is a part of the surface treatment station 304 (FIG. 1). The process gas used for generating the plasma may be a hydrogen-containing gas, which includes a first gas including hydrogen ($H_2$) and argon (Ar), a second gas including $H_2$ and nitrogen ($N_2$), or a third gas including $H_2$ and helium (He). Through the treatment, the number of OH groups at the surface of dielectric layer 110 increases, which is beneficial for forming strong fusion bonds. Furthermore, the hydrogen helps reduce the metal oxide 114 on the surfaces of metal pads 112 back to metal. The plasma treatment may also be performed using pure or substantially pure $H_2$, Ar, or $N_2$ as the process gas, which treats the surfaces of metal pads 112 and surface dielectric layer 110 through reduction and/or bombardment. Using surface treatment station 304 (FIG. 1), package component 200 is also treated; the treatment is essentially the same as the treatment of package component 100.

Figure 4:
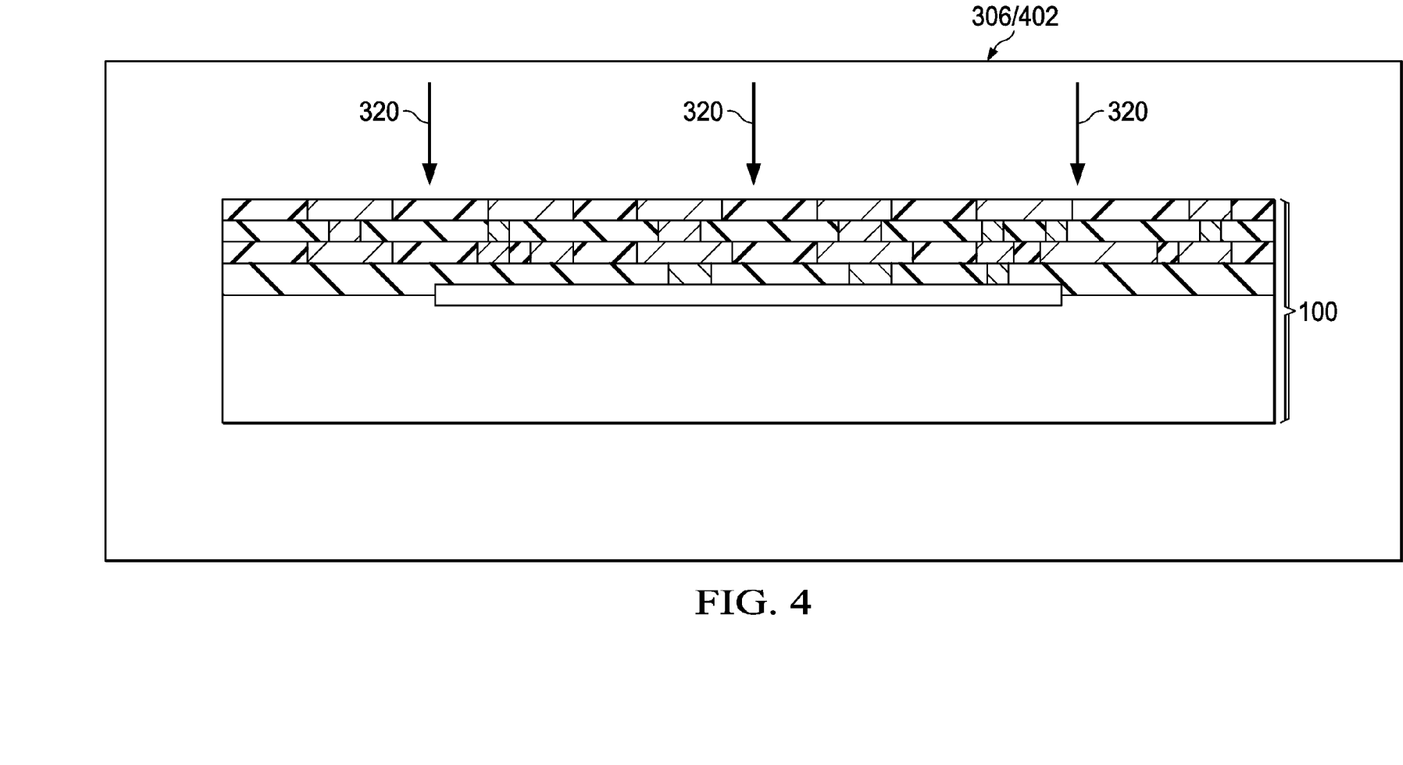

Next, referring to FIG. 4, package component 100 (or 200) is transferred to cleaning station 306, and a chemical cleaning and a De-Ionized (DI) water cleaning/rinse are performed on package component 100. The cleaning station 306 includes chamber 402, which may be sealed to confine the chemical vapors; the chemical vapors are evaporated from the chemicals used in the cleaning processes performed inside chamber 402.

Figure 6:
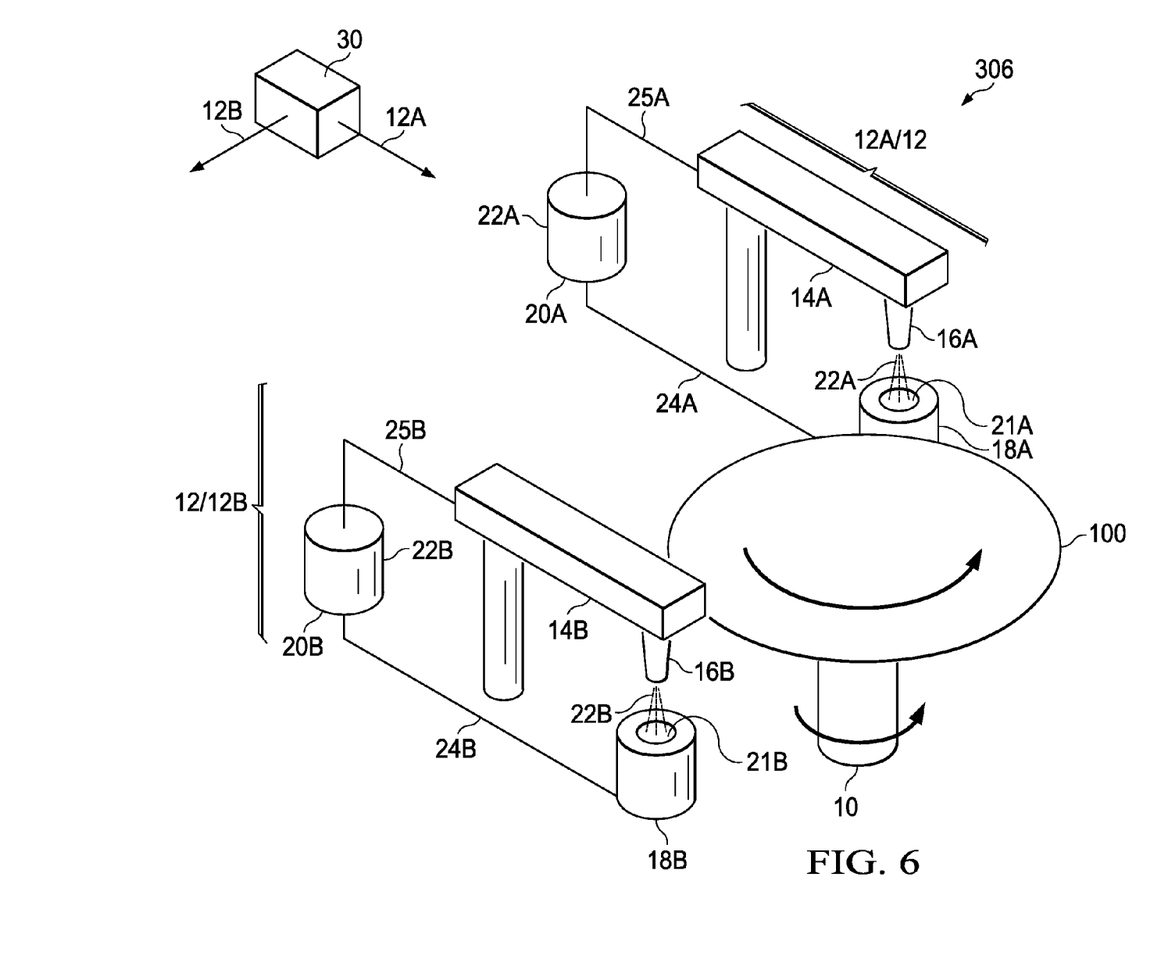
FIGS. 6 through 10 illustrate the cross-sectional views of intermediate stages in a cleaning step using a cleaning module in accordance with some embodiments.
Figure 8:
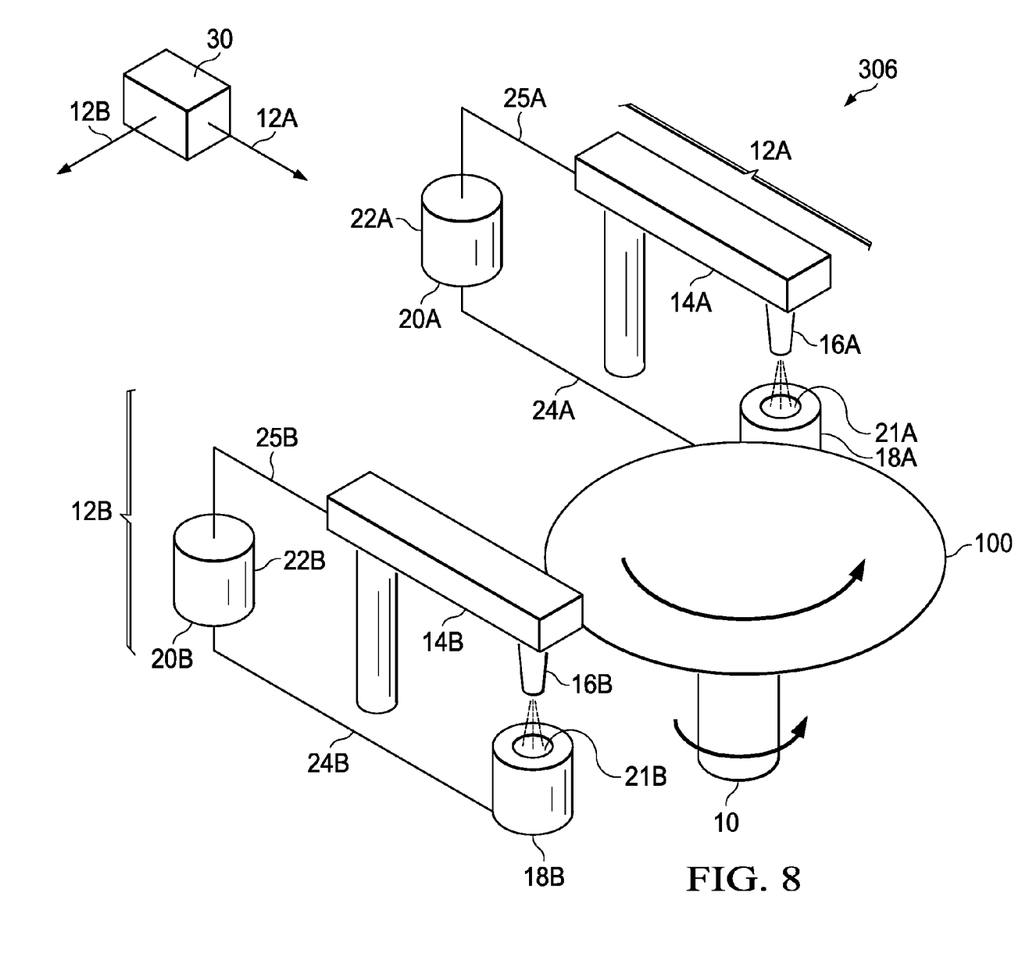
Figure 9:
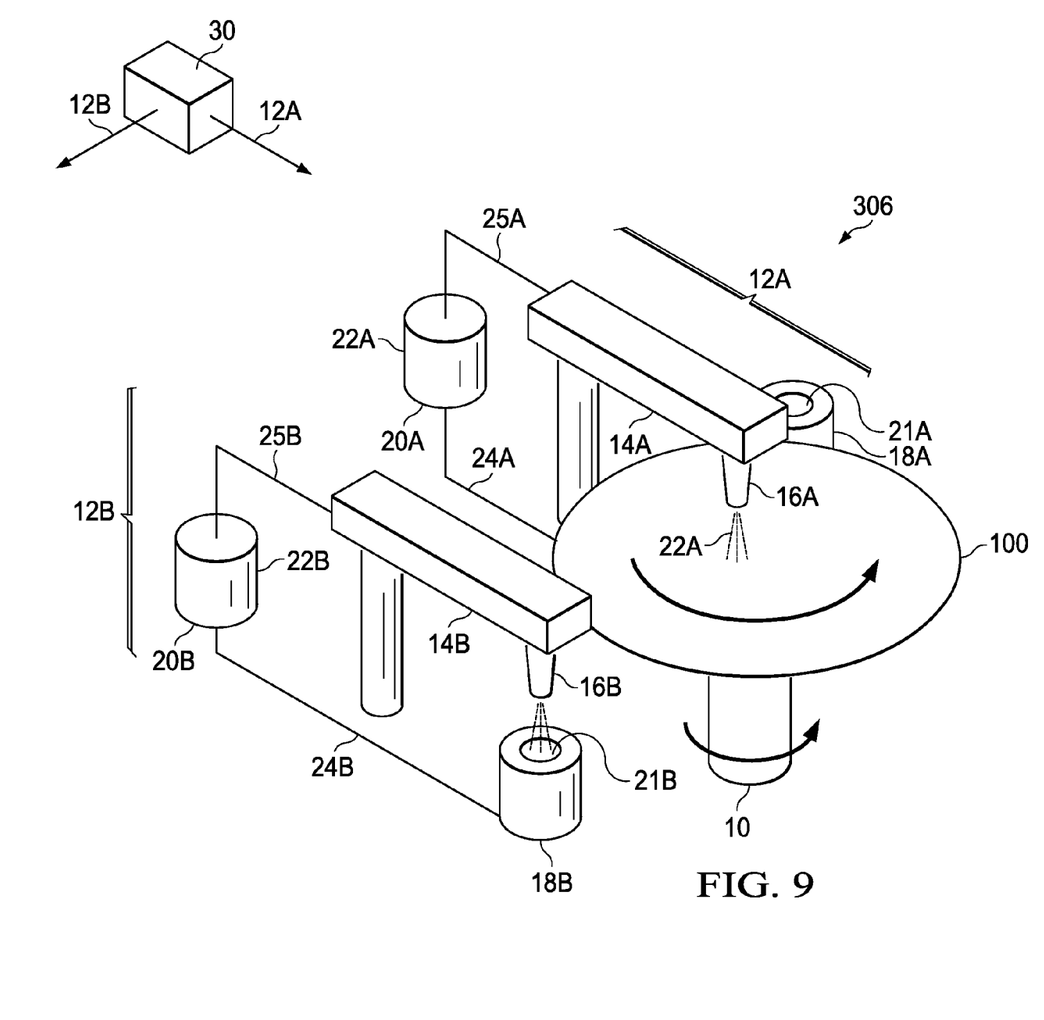
Figure 10:
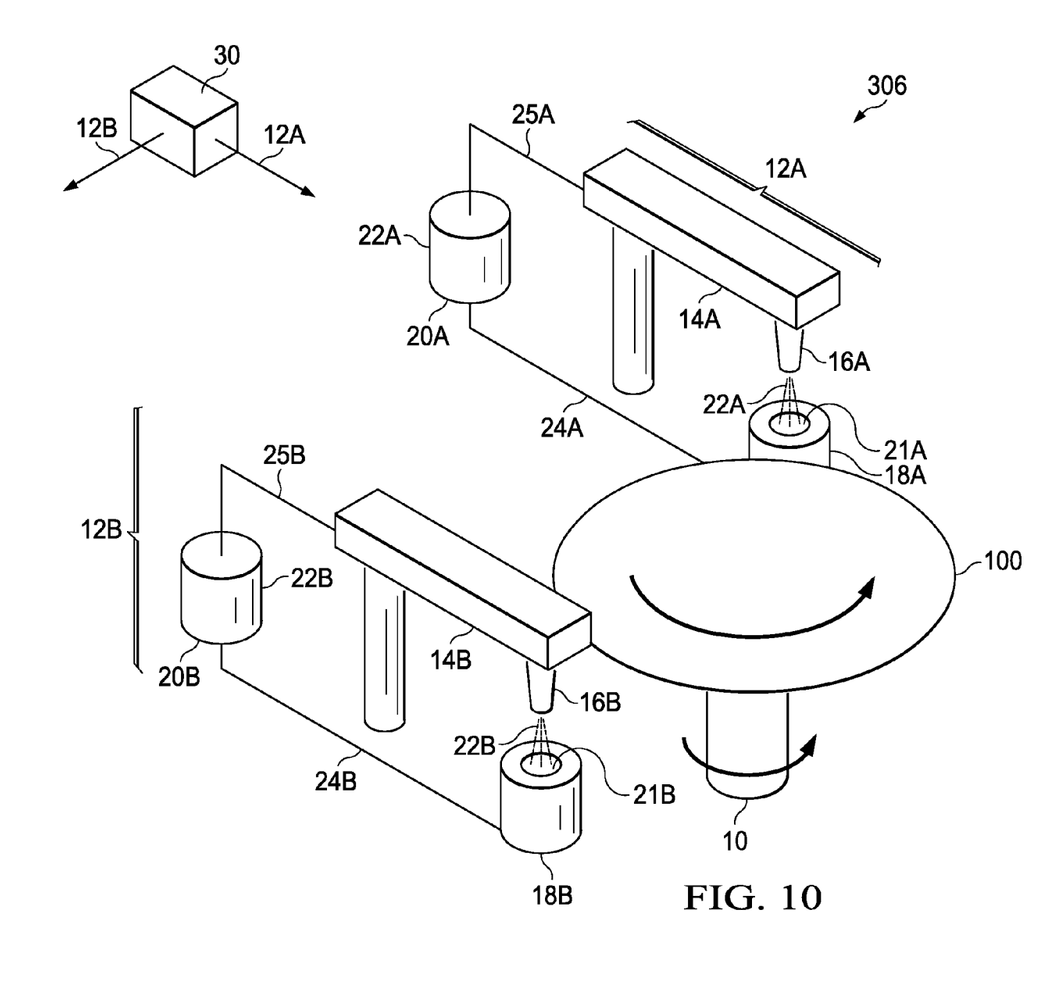

FIGS. 6 through 10 illustrate some exemplary cleaning processes in cleaning station 306. In the exemplary process as shown in FIGS. 6 and 10, the cleaning of wafer 100 is discussed as an example, while wafer 200 may also be cleaned in cleaning station 306 using the same process steps as shown in FIGS. 6 through 10. Referring to FIG. 6, cleaning station 306 includes wafer station 10, which may be an Electronic Chuck (E-chuck). Wafer 100 is placed on wafer station 10 and is rotated by wafer station 10 during the cleaning process.

Cleaning station 306 includes two or more dispensing systems 12, which include dispensing system 12A and dispensing system 12B. Dispensing system 12A is used to dispense chemical solutions, which may be an acid solution such as citrus acid, an alkaline solution such as ammonia solution, or other suitable solutions. Dispensing system 12B may be used to dispense DI water in some embodiments. Alternatively, dispensing system 12B may be used to dispense a chemical solution other than DI water.

Figure 7:
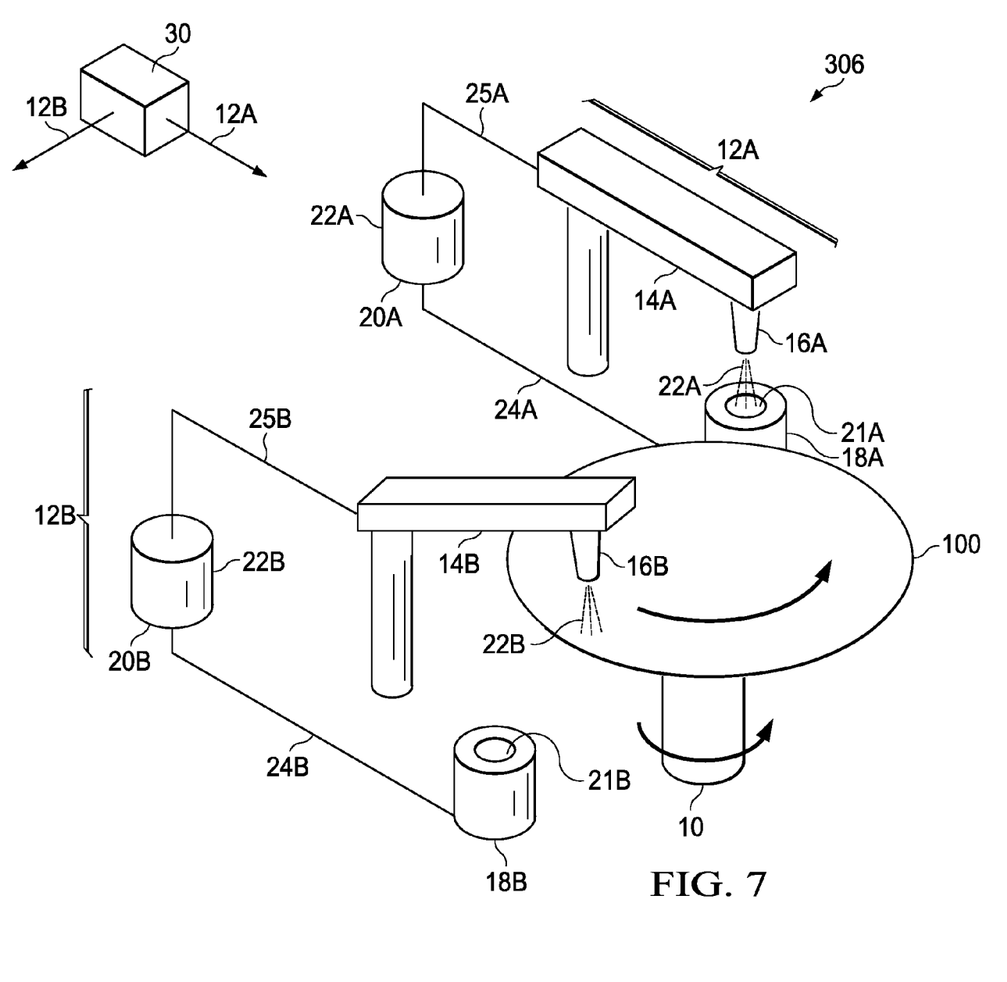

Dispensing system 12A further includes swivel arm 14A, which is configured to swivel onto the top of wafer 100 (as shown in FIG. 7), and swivel back to an idle position, as shown in FIG. 6. Dispensing system 12A is a single-nozzle system that has only a single-nozzle in some embodiments. Dispense nozzle 16A is attached to the top end of swivel arm 14A and is used to dispense the chemical solution. At the idle position, dispense nozzle 16A is not directly over wafer 100. In accordance with some embodiments, storage tank 20A, which stores chemical solution 22A, is connected to swivel arm 14A and nozzle 16A so that chemical solution 22A may be conducted to dispense nozzle 16A, for example, through the channel in swivel arm 14A.

In accordance with some embodiments, solution-collecting tank 18A is located at the idle position of swivel arm 14A. Solution-collecting tank 18A has an opening 21A facing dispense nozzle 16A when swivel arm 14A is at the idle position. Accordingly, at the idle position, the chemical solution 22A may be dispensed into solution-collecting tank 18A if needed. In accordance with some embodiments, solution-collecting tank 18A is connected to pipe 24A, which is further connected to storage tank 20A, so that the collected chemical solution dispensed by dispense nozzle 16A is conducted back to storage tank 20A.

Swivel arm 14A, dispense nozzle 16A, solution-collecting tank 18A, pipe 24A, and storage tank 20A form a loop wherein the chemical solution 22A may continuously flow. This avoids the condensation problem, which is caused by the condensation of the chemical in the chemical solution when it does not flow. The condensation of chemical is also caused partly due to the fact that the water in the chemical solution evaporates. The condensed chemical solution causes process deviation, the clogging of the pipes, and other problems. Hence, by making chemical solution 22A flow continuously in the loop, the condensation problem is avoided.

Dispensing system 12B is used to dispense DI water 22B in some embodiments. Dispensing system 12B is also a single-nozzle system in some embodiments. Dispensing system 12B may have a similar or identical design to dispensing system 12A in some embodiments. In alternative embodiments, dispensing systems 12B and 12A have different designs. In some embodiments, dispensing system 12B includes swivel arm 14B, dispense nozzle 16B, solution-collecting tank 18B, pipe 24B, and storage tank 20B, which forms a loop so that DI water may continuously flow in the loop when the swivel arm 14B is in the idle position. Since DI water does not include chemicals therein, there is no condensation problem. Accordingly, in alternative embodiments, dispensing systems 12B do not include solution-collecting tank 18B and pipe 24B. Hence, at the idle position, the DI water 22B is not dispensed from nozzle 16B. FIG. 6 illustrates that swivel arm 14B is at the idle position.

Although not shown, cleaning station 306 may include more than two dispensing systems 12. For example, there may be three dispensing systems 12, wherein one of dispensing systems 12 may be used to dispense an acid solution, one of dispensing systems 12 may be used to dispense an alkaline solution, and one of dispensing systems 12 may be used to dispense de-ionized (DI) water.

Referring to FIG. 7, swivel arm 14B is rotated/moved so that dispense nozzle 16B is moved until it is directly over wafer 100. DI water 22B may then be dispensed onto the top surface of wafer 100. Swivel arm 14B may also move between the edge and the center of wafer 100. During the dispensing of DI water 22B, wafer 100 is rotated continuously at a low speed between, for example, about 20 Rotations Per Minute (RPM) and about 30 RPM. The entire wafer 100 is rinsed by DI water 22B.

After the DI water rinse, the dispensing of DI water 22B is stopped, and nozzle 16B no longer provides DI water. In some embodiments, a suck back process is performed so that the remaining DI water in pipe 25B, the pipe in swivel arm 14B, and dispense nozzle 16B are sucked back into, for example, storage tank 20B. As a result, substantially no DI water is left in the pipes and dispense nozzle 16B. This prevents the dripping of DI water onto wafer 100 after shutting off the DI water flow.

Although there is no DI water in the pipes, there may be residue DI water droplets outside the pipes and near the tip of nozzle. The residue DI water droplets may drop off any time onto wafer 100, causing yield loss. Accordingly, swivel arm 14B may vibrate to make the residue DI water droplet drop on wafer 100. This ensures that the residue DI water droplets will fall on wafer 100 before the subsequent high-speed spin of wafer 100, so that the residue DI water droplets will be spun off rather than dropping when the spinning has started.

Figure 11:
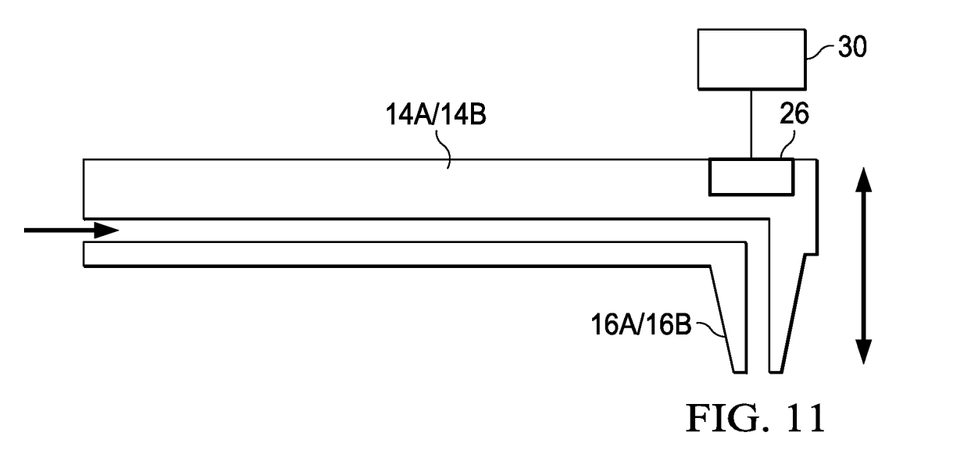
FIG. 11 illustrates a cross-sectional view of a swivel arm and a vibrating device attached thereon in accordance with some embodiments.

In accordance with some embodiments of the present disclosure, swivel arm 14B includes vibrating device 26, as shown in FIG. 11. Vibrating device 26 may be an ultrasonic device that is configured to generate ultrasonic sound, for example. As a result, swivel arm 14B vibrates to remove the residue DI water droplets. In alternative embodiments, swivel arm 14B may use other mechanisms to cause swivel arm 14B and nozzle 16B to vibrate, which may include, for example, adopting an eccentric wheel vibration motor as vibrating device 26.

Referring back to FIG. 7, after the vibration of swivel arm 14B, swivel arm 14B moves back to the idle position, as shown in FIG. 8. During the movement back to the idle position, no DI water is dispensed through nozzle 16B. Next, wafer 100 is rotated at a high speed, for example, at about 1,500 RPM or higher, so that the DI water on wafer 100 is spun off. During the high-speed spin off, since dispense nozzle 16B is no longer over wafer 100, there is no risk of residue DI water droplets falling on wafer 100.

As shown in FIG. 8, in some embodiments, after swivel arm 14B is back to the idle position, no DI water is dispensed until the next time swivel arm 14B is moved over wafer 100 or another wafer on wafer station 10. In alternative embodiments, at the idle position, cleaning station 306 is controlled, for example, by controller unit 30, so that the dispensing of DI water is restarted. The dispensed DI water is collected by solution-collecting tank 18B, and is sent back to storage tank 20B through pipe 24B. The DI water in storage tank 20B is dispensed to dispense nozzle 16B. During the cycle of the flow of DI water, the DI water is in a clean environment and is not polluted. Accordingly, the DI water may be used for the subsequent cleaning of wafers.

Referring to FIG. 9, after swivel arm 14B is back to the idle position, swivel arm 14A is rotated so that dispense nozzle 16A is moved over wafer 100. Nozzle 16A then starts to dispense a chemical solution 22A such as an acid solution or an alkaline solution. Swivel arm 14A may also move between the edge and the center of wafer 100. During the dispensing of chemical solution 22A, wafer 100 is rotated continuously at low speeds between, for example, about 20 RPM and about 30 RPM. In accordance with some embodiments, the cleaning done by chemical solution 22A causes the removal of the undesirable metal oxide 114 (FIG. 2).

After the dispensing of chemical solution 22A, the dispensing of chemical solution 22A is stopped, and nozzle 16A no longer provides chemical solution 22A. In some embodiments, a suck back process is performed so that the remaining chemical solution 22A in pipe 25A, the pipe in swivel arm 14A, and dispense nozzle 16 is sucked back to, for example, storage tank 20A. As a result, substantially no chemical solution 22A is left in the pipes and dispense nozzle 16. This prevents the dripping of chemical solution 22A onto wafer 100 after shutting off the chemical solution from wafer 100.

Although there is no chemical solution 22A in the pipes, there may be residue chemical droplets outside the pipes and near the tip of nozzle 16A. The residue chemical droplets may drop off any time onto wafer 100, causing yield loss. Accordingly, swivel arm 14A may vibrate to make the residue chemical droplets drop on wafer 100 at a controlled time. This ensures that the residue chemical droplets will fall on wafer 100 before the subsequent high-speed spin of wafer 100, so that the residue chemical droplets will spin off rather than dropping after the spinning has begun.

In accordance with some embodiments of the present disclosure, swivel arm 14A includes vibrating device 26, as also shown in FIG. 11, wherein vibrating device 26 on swivel arm 14A may be the same as or different from the vibrating device 26 on swivel arm 14B. As a result of the vibrating of swivel arm 14A, the residue DI chemical solution droplets are removed from dispense nozzle 16A.

Referring to FIG. 10, after the vibration of swivel arm 14A, swivel arm 14A is moved back to the idle position. During the movement back to the idle position, no chemical solution is dispensed through nozzle 16A. Next, wafer 100 is rotated at a high speed of, for example, about 1,500 RPM or higher so that the chemical solution spins off from wafer 100. During the high-speed spin off, since dispense nozzle 16A is no longer over wafer 100, there is no risk of residue chemical solution droplets falling on wafer 100.

As shown in FIG. 10, in some embodiments, after swivel arm 14B is back to the idle position, no DI water is dispensed until the next time swivel arm 14B is moved over wafer 100 or another wafer on wafer station 10. In alternative embodiments, at the idle position, cleaning station 306 is controlled, for example, by controller unit 30 so that the dispensing of the chemical solution 22A is restarted. The dispensed chemical solution is collected by solution-collecting tank 18A and is sent back to storage tank 20A. From storage tank 20A, the chemical solution is dispensed to dispense nozzle 16A again. During the cycle of the flow of the chemical solution, the chemical solution 22A is in a clean environment and is not polluted. Accordingly, the chemical solution 22A may be used for subsequent cleaning of the wafer.

After the chemical cleaning as shown in FIGS. 9 and 10, an additional DI water rinse is performed. The process steps are essentially the same as shown in and described for FIGS. 7 and 8 and hence are not repeated herein.

The operations in FIGS. 6 through 10 are controlled by, and are synchronized by, controller unit 30. For example, controller unit 30 may control and time the dispensing of DI water 22B and chemical solution 22A, the movement of swivel arms 14A and 14B, the sucking back of DI water 22B and chemical solution 22A, the vibration of swivel arms 14A and 14B, and the continued flow of DI water 22B and chemical solution 22A.

Figure 5:
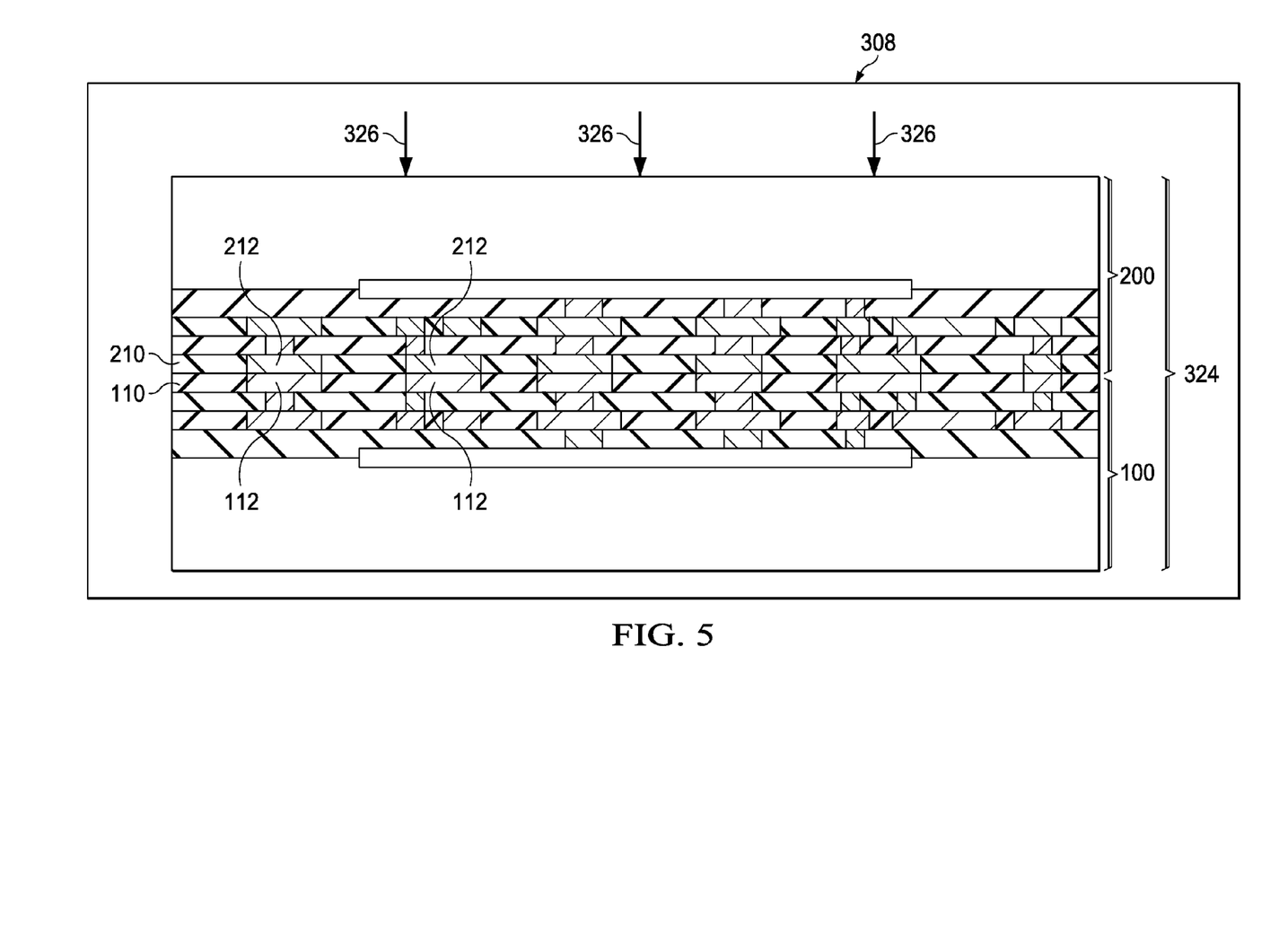

After the additional DI water rinse, wafer 100 may be moved out of cleaning station 306 to pre-bond station 308, as shown in FIG. 1. Wafer 200 is also treated in surface treatment station 304 and cleaned in cleaning station 306 in a way similar to the treating of wafer 100. Next, as shown in FIG. 5, package components 100 and 200 are transferred into pre-bonding station 308 (also refer to FIG. 1). Package components 100 and 200 are aligned, with bond pads 112 of package component 100 being aligned to bond pads 212 of package component 200. The alignment may be performed in pre-bonding station 308 (which is an alignment and pre-bonding station in these embodiments), although it may also be performed in a separate alignment station. After the alignment, package components 100 and 200 are pressed against each other. As shown in FIG. 5, during the pre-bonding, pressing force 326 is applied to press package components 100 and 200 against each other. Pressing force 326 may be lower than about 5 Newtons per die in some exemplary embodiments, although a greater or smaller force may also be used. The pre-bonding may be performed at room temperature (between about 21° C. and about 25° C.), although higher temperatures may be used. The bonding time may be shorter than about 1 minute, for example.

After the pre-bonding, surface dielectric layer 110 and 210 are bonded to each other. The bond, however, needs to be strengthened in a subsequent annealing step. The bonded package components 100 and 200 in combination are referred to as bonded pair 324 hereinafter. Bonded pair 324 is unloaded out of pre-bonding station 308 (FIG. 1), and is transferred to annealing station 312 (FIG. 1) for annealing.

In annealing station 312, the bonded pair 324 is annealed at a temperature between about 300° C. and about 400° C., for example. The annealing may be performed for a period of time between about 1 hour and 2 hours in some exemplary embodiments. When the temperature rises, the OH bonds in oxide layers 110 and 210 (FIG. 5) break to form strong Si—O—Si bonds, and hence package components 100 and 200 are bonded to each other through fusion bonds. In addition, during the annealing, the copper in metal pads 112 and 212 diffuse to each other so that metal-to-metal bonds are also formed. Hence, the resulting bonds between package components 100 and 200 are hybrid bonds.

The embodiments of the present disclosure have some advantageous features. In conventional cleaning processes, two or more nozzles, which dispense different solutions, share a same swivel arm. Hence, the solution from one nozzle may contaminate the other nozzle. With two or more swivel arms in accordance with the embodiments of the present disclosure, however, the nozzles for dispensing different solutions are separated from each other. Hence, the possibility that the droplet of one solution contaminating its neighboring nozzles is eliminated. In addition, through the vibration of swivel arms and the sucking back function, no residue of DI water and chemical solution will dropped on wafers. Furthermore, with the continued flow of the chemical solution and/or DI water at idle positions, the condensation of chemical solution is eliminated.

In accordance with some embodiments of the present disclosure, an apparatus for cleaning a wafer includes a wafer station configured to hold the wafer, and a first and a second dispensing system. The first dispensing system includes a first swivel arm, and a first nozzle on the first swivel arm, wherein the first swivel arm is configured to move the first nozzle over and aside of the wafer. The first dispensing system includes first storage tank connected to the first nozzle, with the first nozzle configured to dispense a solution in the first storage tank. The second dispensing system includes a second swivel arm, and a second nozzle on the second swivel arm, wherein the second swivel arm is configured to move the second nozzle over and aside of the wafer. The second dispensing system includes a second storage tank connected to the second nozzle, with the second nozzle configured to dispense a solution in the second storage tank.

In accordance with alternative embodiments of the present disclosure, an apparatus for cleaning a wafer includes a dispensing system, which includes a first swivel arm and a nozzle on the swivel arm. The swivel arm is configured to move the nozzle over the wafer, and to move the nozzle aside of the wafer. The dispensing system further includes a vibrating device in the dispensing system. The vibrating device is configured to vibrate the nozzle. A storage tank is connected to the nozzle, with the nozzle configured to dispense a solution in the storage tank.

In accordance with yet alternative embodiments of the present disclosure, a method includes dispensing a first solution onto a wafer through a first swivel arm and a first nozzle on the first swivel arm, and returning the first swivel arm to a first idle position. The method further includes dispensing a second solution onto the wafer through a second swivel arm and a second nozzle on the second swivel arm, and returning the second swivel arm to a second idle position.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An apparatus for cleaning a wafer, the apparatus comprising:
   a wafer station configured to hold the wafer thereon;
   a first dispensing system comprising:
      a first swivel arm;
      a first nozzle on the first swivel arm, wherein the first swivel arm is configured to move the first nozzle over the wafer, and to move the first nozzle aside of the wafer;
      a first storage tank connected to the first nozzle, with the first nozzle configured to dispense a first solution in the first storage tank, wherein the first nozzle comprises a conduit for conducting the first solution, and the conduit comprises a straight portion, with an end of the straight portion being an exit point of the first nozzle; and
      a vibrating device configured to vibrate the first nozzle, wherein the vibrating device is aligned to the straight portion;
   a second dispensing system comprising:
      a second swivel arm;
      a second nozzle on the second swivel arm, wherein the second swivel arm is configured to move the second nozzle over the wafer, and to move the second nozzle aside of the wafer; and
      a second storage tank connected to the second nozzle, with the second nozzle configured to dispense a second solution in the second storage tank.

2. The apparatus of claim 1, wherein each of the first swivel arm and the second swivel arm has a single nozzle attached thereon.

3. The apparatus of claim 1, wherein the first dispensing system is further configured to suck back the first solution in the first nozzle.

4. The apparatus of claim 1 further comprising a vibrating device in the first dispensing system, wherein the vibrating device is configured to vibrate the first nozzle.

5. The apparatus of claim 4, wherein the vibrating device comprises an ultrasonic generating device.

6. The apparatus of claim 1 further comprising:
   a solution-collecting tank comprising an opening aligned to the first nozzle with the first swivel arm at an idle position; and
   a pipe connecting the solution-collecting tank to the first storage tank.

7. The apparatus of claim 1 further comprising a control unit configured to:
   start the dispensing the first solution;
   after the dispensing the first solution, start sucking back the first solution from the first nozzle; and
   after the dispensing the first solution, start vibrating the nozzle.

8. An apparatus for cleaning a wafer, the apparatus comprising:
   a first dispensing system comprising:
      a first swivel arm;
      a first nozzle on the first swivel arm, wherein the first swivel arm is configured to move the first nozzle over the wafer, and to move the first nozzle aside of the wafer;
      a vibrating device in the first dispensing system, wherein the vibrating device is configured to vibrate the first nozzle; and
      a first storage tank connected to the first nozzle, with the first nozzle configured to dispense a first solution in the first storage tank; and
   a control unit configured to time operations of the first nozzle and the vibrating device, and to control the vibrating device to vibrate the first nozzle after the first nozzle finishes dispensing the first solution.

9. The apparatus of claim 8, wherein the vibrating device comprises an ultrasonic generating device.

10. The apparatus of claim 8 further comprising:
    a second dispensing system comprising:
       a second swivel arm;
       a second nozzle on the second swivel arm, wherein the second swivel arm is configured to move the second nozzle over the wafer, and to move the second nozzle aside of the wafer; and
       a second storage tank connected to the second nozzle, with the second nozzle configured to dispense a second solution in the second storage tank.

11. The apparatus of claim 8, wherein the first swivel arm has a single nozzle attached thereon.

12. The apparatus of claim 8, wherein the first dispensing system is further configured to suck back the first solution in the first nozzle.

13. The apparatus of claim 8 further comprising:
    a solution-collecting tank comprising an opening aligned to the first nozzle with the first swivel arm at an idle position; and
    a pipe connecting the solution-collecting tank to the first storage tank.

14. The apparatus of claim 8, wherein the first dispensing system is comprised in a hybrid bonding system.

15. An apparatus for cleaning a wafer, the apparatus comprising:
    a first dispensing system comprising:
       a first swivel arm;
       a first nozzle located at an end of the first swivel arm, wherein the first swivel arm is configured to move the first nozzle directly over the wafer, and to move the first nozzle to a first location not directly over the wafer; and
       a first storage tank connected to the first nozzle, with the first nozzle configured to dispense a first solution in the first storage tank to the wafer, wherein the first dispensing system is further configured to suck back the first solution in the first nozzle back into the first storage tank;
    a vibrating device attached to the first nozzle; and
    a control unit configured to time operations of the first nozzle and the vibrating device, and to control the vibrating device to vibrate the first nozzle after the first nozzle finishes dispensing the first solution.

16. The apparatus of claim 15, wherein the vibrating device is configured to vibrate the first nozzle through ultrasonic sound.

17. The apparatus of claim 15 further comprising a solution-collecting tank at a location directly under the first nozzle when the first nozzle is at the first location, wherein the solution-collecting tank is connected to the first storage tank.

18. The apparatus of claim 17, wherein the first dispensing system is further configured to loop the first solution in a close-loop comprising the first nozzle, the solution-collecting tank, and the first storage tank.

19. The apparatus of claim 15 further comprising:
    a second dispensing system comprising:
       a second swivel arm;
       a second nozzle on the second swivel arm, wherein the second swivel arm is configured to move the second nozzle directly over the wafer, and to move the second nozzle to a second location not directly over the wafer; and a second storage tank connected to the second nozzle, with the second nozzle configured to dispense a second solution in the second storage tank.

20. The apparatus of claim 15, wherein the first dispensing system is a part of a hybrid bonding system.

* * * * *